United States Patent
Sung et al.

(10) Patent No.: US 7,687,374 B2
(45) Date of Patent: Mar. 30, 2010

(54) METHOD OF ISOLATING SEMICONDUCTOR LASER DIODES

(75) Inventors: Youn Joon Sung, Gyeonggi-do (KR); Su Hee Chae, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/149,313

(22) Filed: Apr. 30, 2008

(65) Prior Publication Data

US 2009/0155939 A1    Jun. 18, 2009

(30) Foreign Application Priority Data

Dec. 17, 2007    (KR) .................... 10-2007-0132501

(51) Int. Cl.
*H01L 21/00* (2006.01)
(52) U.S. Cl. ............................... 438/460; 257/E21.238
(58) Field of Classification Search ............ 438/11, 438/22, 33, 39, 71, 113, 460; 257/13, 98, 257/E21.238
See application file for complete search history.

(56) References Cited

U.S. PATENT DOCUMENTS 6,278,173 B1    8/2001    Kobayashi et al.
6,667,186 B2 *    12/2003    Choi ........................... 438/33
2004/0191942 A1 *    9/2004    Kawakami et al. ............ 438/33
2005/0093009 A1 *    5/2005    Kuramoto ..................... 257/98

FOREIGN PATENT DOCUMENTS

KR    10-2006-0064777 A    6/2006

* cited by examiner

*Primary Examiner*—W. David Coleman
*Assistant Examiner*—Christine Enad
(74) *Attorney, Agent, or Firm*—McDermott Will & Emery LLP

(57) ABSTRACT

Provided is a method of isolating semiconductor laser diodes (LDs), the method including the steps of: preparing a substrate; forming a plurality of semiconductor LDs on the substrate, each semiconductor LD including an n-type semiconductor layer, an active layer, a p-type semiconductor layer, an n-electrode, a ridge portion, and a p-electrode, the ridge portion being formed by etching the p-type semiconductor layer such that a portion of the p-type semiconductor layer protrudes, the p-electrode being formed on the ridge portion; partially forming base cut lines on the surface of the substrate excluding the ridge portions; and isolating the semiconductor LDs into a bar shape along the base cut lines.

8 Claims, 6 Drawing Sheets

[FIG. 1]
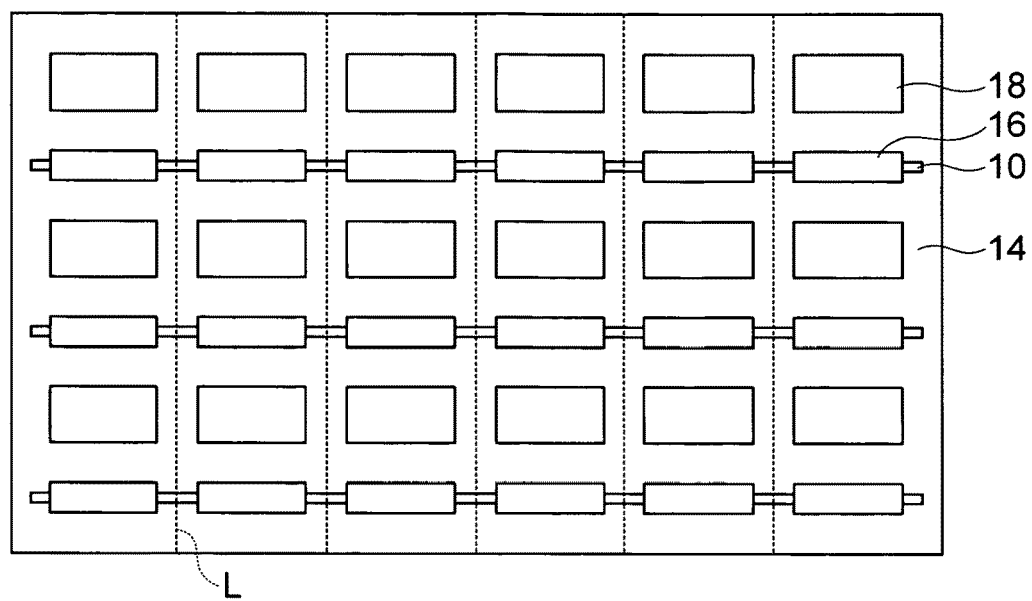
[FIG. 2]
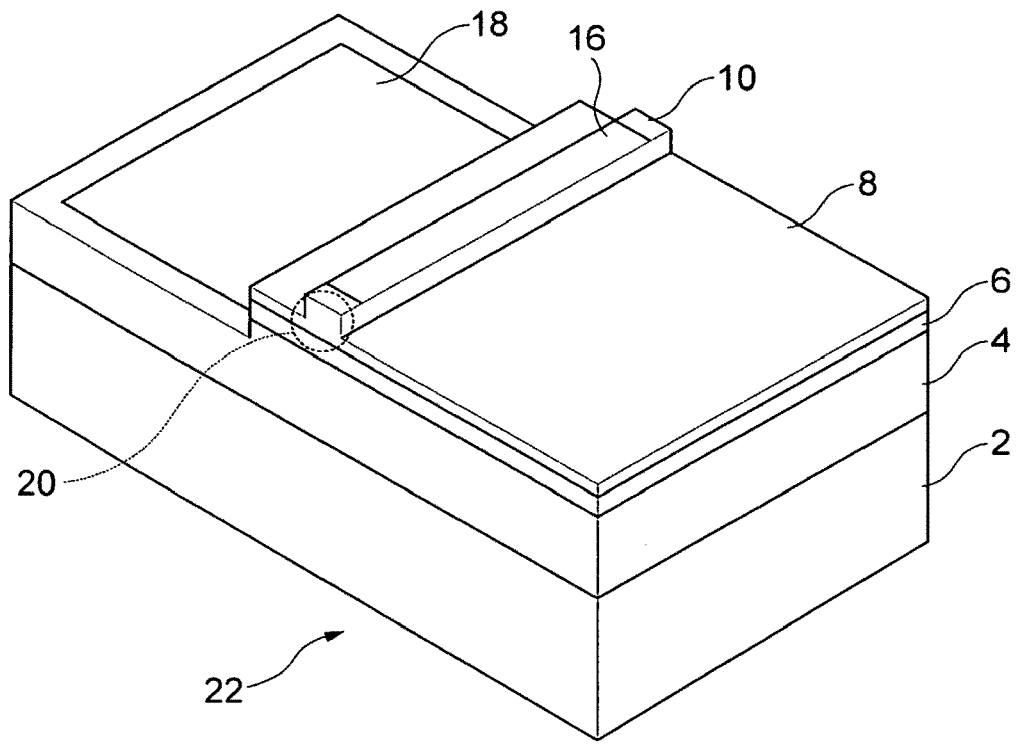

[FIG. 3]
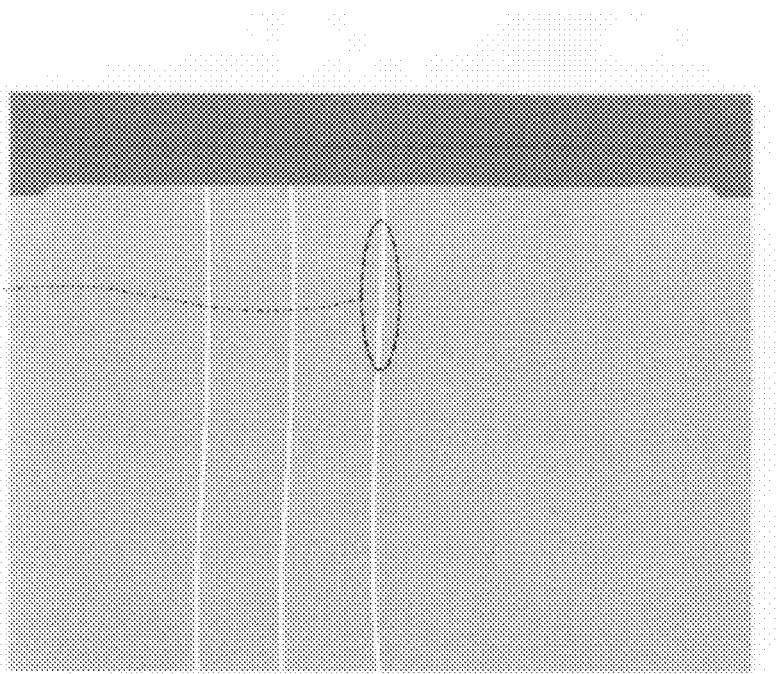
STRIATION
[FIG. 4]
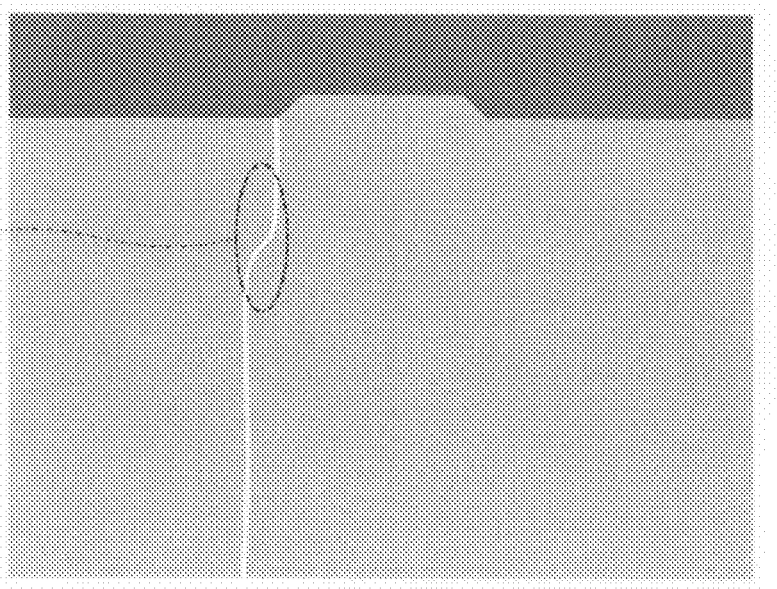
STRIATION

[FIG. 5A]
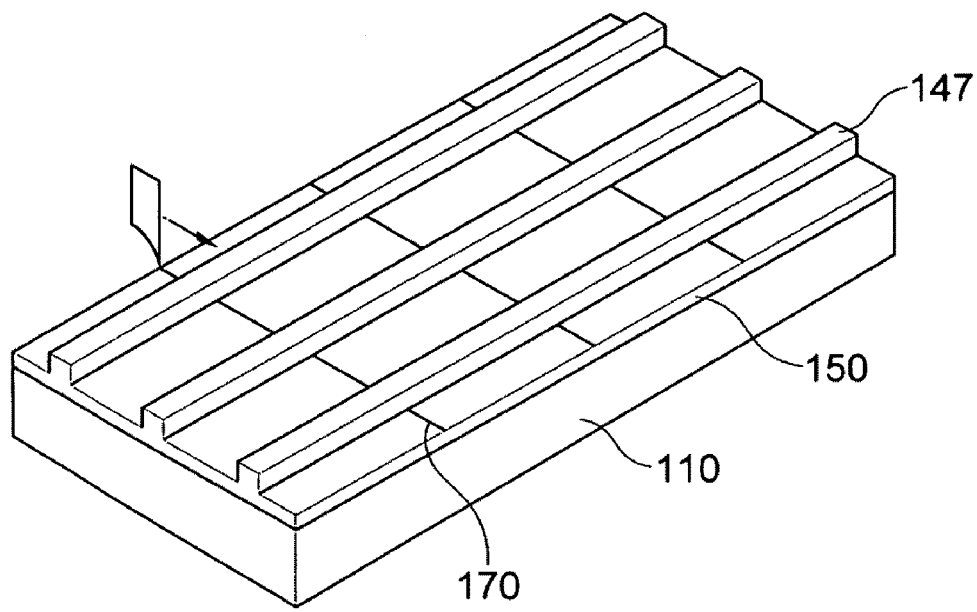
[FIG. 5B]
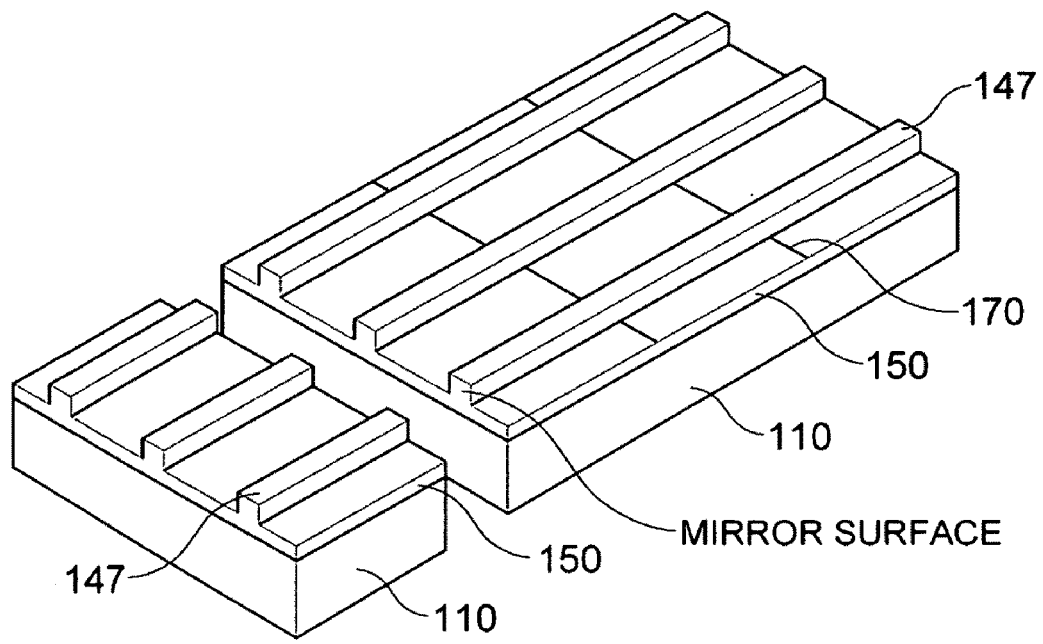

[FIG. 5C]
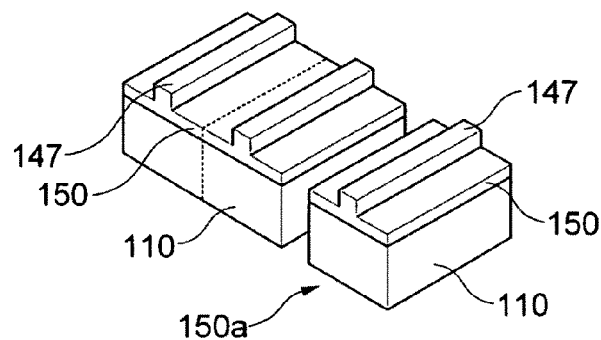
[FIG. 6]
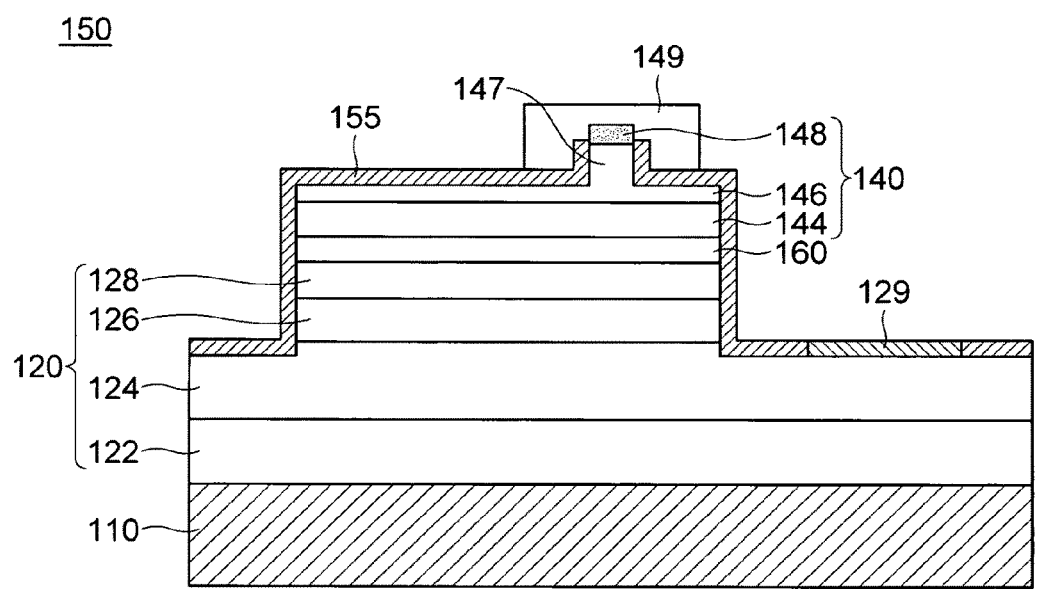

[FIG. 7]
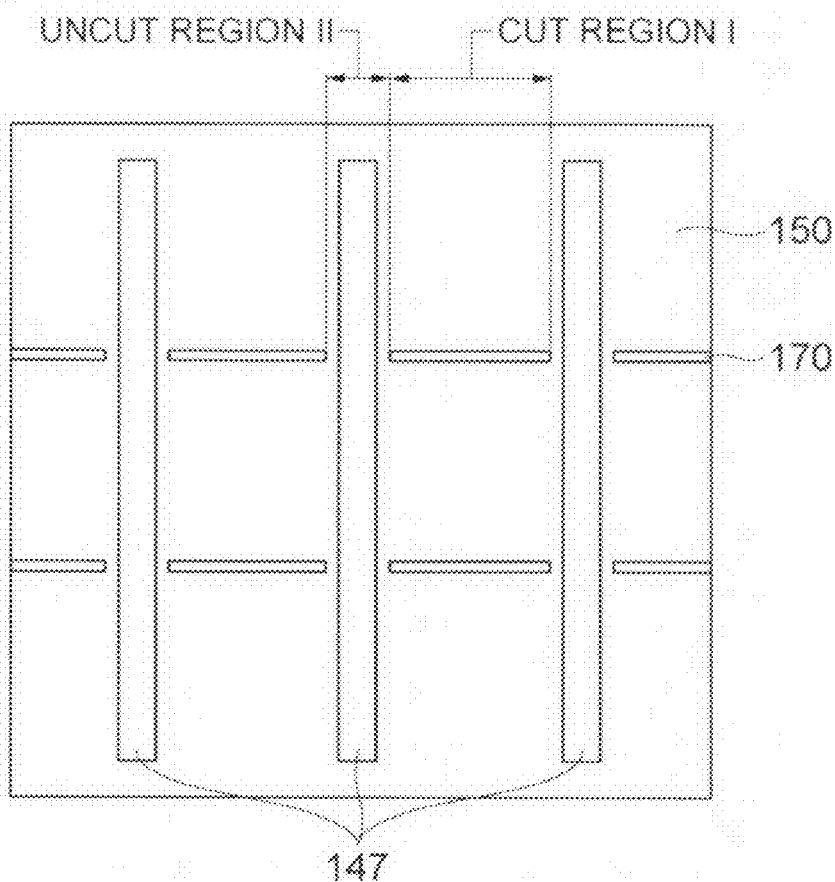
[FIG. 8]
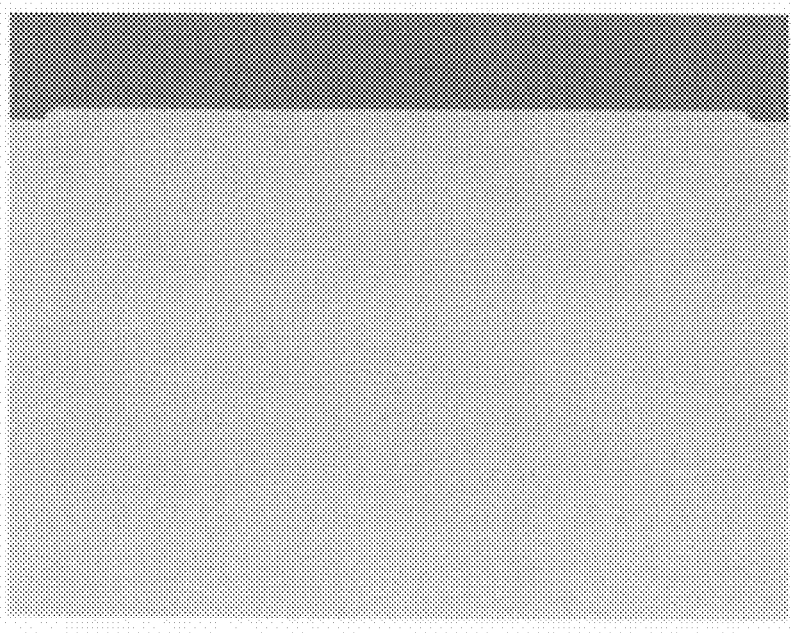

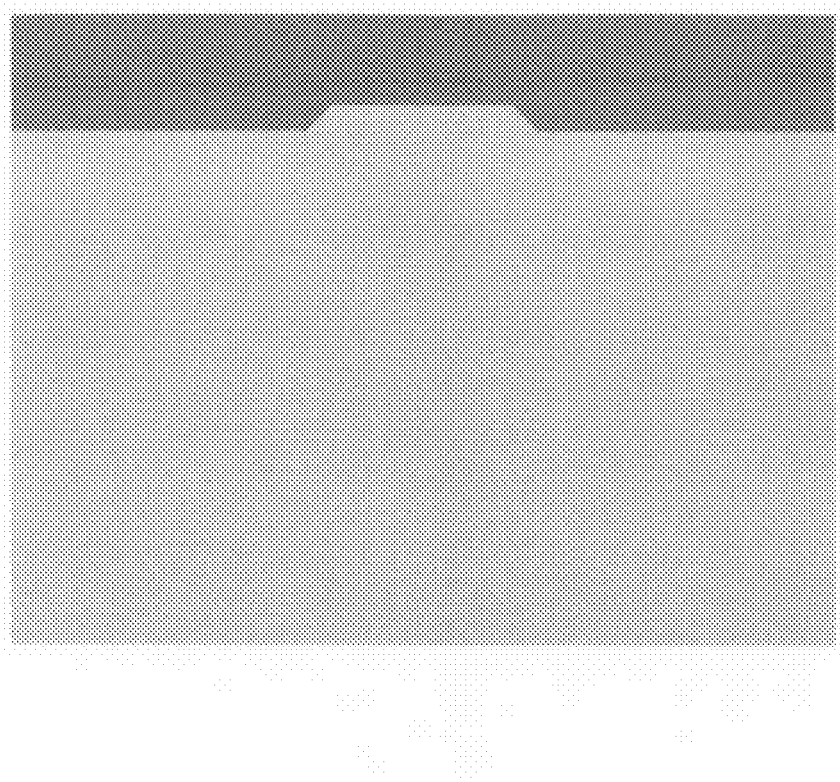
[FIG. 9]

METHOD OF ISOLATING SEMICONDUCTOR LASER DIODES

CROSS-REFERENCE TO RELATED APPLICATIONS

This application claims the benefit of Korean Patent Application No. 10-2007-0132501 filed with the Korea Intellectual Property Office on Dec. 17, 2007, the disclosure of which is incorporated herein by reference.

BACKGROUND OF THE INVENTION

1. Field of the Invention

The present invention relates to a method of isolating semiconductor laser diodes (hereinafter, referred to as semiconductor LD).

2. Description of the Related Art

As necessity for high-density information recording increases, demand for semiconductor light emitting diodes which emit visible light is increasing. Accordingly, various types of semiconductor LDs which can emit a visible range of laser are being manufactured. Among them, a group III-V nitride semiconductor LD is a direct transition type LD of which the laser oscillation probability is high and which can perform blue laser oscillation. Therefore, the group III-V nitride semiconductor LD is attracting attention.

In general, to manufacture a high-power semiconductor LD of which the threshold current value is low, a semiconductor LD should be cut in such a manner that the cut surface thereof is smooth while the laser emitting surface of the cut semiconductor LD is perpendicular to an oscillation layer.

However, when the laser emitting surface is not perpendicular to the oscillation layer and the surface becomes rough during the process of cutting the semiconductor LD, the brightness of laser is significantly reduced, and laser is diffused on the laser emitting surface.

In this case, the critical current of the semiconductor LD increases.

Now, a conventional method of isolating semiconductor LDs, which relates to the cutting of the semiconductor laser diode, will be described with reference to FIGS. 1 and 2.

First, an n-type GaN-based compound semiconductor layer 4, a GaN-based active layer 6 where laser emission is performed, and a p-type GaN-based compound semiconductor layer 8 are sequentially formed on a sapphire substrate 2. Then, a predetermined etching process is performed to form a plurality of semiconductor LDs of which each has a ridge portion 10 and an n-electrode portion 14.

Subsequently, a p-electrode 16 and an n-electrode 18 are formed on the ridge portion 10 and the n-electrode portion 14, respectively. Then, base cut lines are formed on the bottom surface of the sapphire substrate 2.

The base cut line is formed along a virtual isolation line L for isolating the semiconductor LDs by using a diamond tip.

After the base cut lines are formed on the bottom surface of the sapphire substrate 2, a predetermined force is applied onto the ridge portion 10 on the virtual isolation line L by using a ceramic knife. Then, as shown in FIG. 2, the semiconductor LDs 22 are isolated from each other such that a cleavage plane 20 is formed on each of the semiconductor LDs 22. The cleavage plane 20 is used as a light emitting surface.

To reduce a threshold current Ith and increase power, the cleavage plane 20 should be perpendicular to the active layer 6, and the smooth state of the cleavage plane should be maintained.

In the conventional method, however, the n-type compound semiconductor layer, the active layer, and the p-type compound semiconductor layer, which are formed on the substrate, should be cut. Therefore, after the base cut lines are formed, a force should be applied to the ridge portion 10 on the virtual isolation line L. When the force is applied to the ridge portion 10, the ridge may be damaged, and a crack may occur so as to propagate to the light emitting surface.

Further, since the cross-sectional surface formed along the base cut line formed on the bottom surface of the substrate is not smooth, the rough portion of the bottom surface of the substrate corresponding to the position of the ridge propagates to the ridge portion. Therefore, the surface of the light emitting surface (cleavage plane) becomes rougher.

FIGS. 3 and 4 are SEM (scanning electron microscope) photographs showing a state where the rough portion of the bottom surface of the substrate propagates to the ridge portion such that a stepped portion is formed on the light emitting surface (cleavage plane). FIG. 3 shows the cleavage plane excluding the ridge portion, and FIG. 4 shows the cleavage plane of the ridge region.

As shown in FIGS. 3 and 4, it can be found that a stepped surface referred to as striation is formed on the cut surface of the substrate, that is, the cleavage plane. The striation which propagates from the substrate 110 increases an operation current of elements and degrades an optical characteristic.

In the above-described conventional method, after the base cut lines are formed on the bottom surface of the sapphire substrate 110 on which the semiconductor LDs are not formed, a force is applied to the surface of the substrate 110, on which the semiconductor LDs are formed, to thereby isolating the semiconductor LDs from each other. Therefore, the force is concentrated on the ridge portion such that the ridge is damaged, and a stepped surface (striation) is formed on the cleavage plane.

The damage of the ridge and the light emitting surface degrades the optical characteristic of the semiconductor LDs, such as the shape of spots or an output, as well as the electrical characteristic of the semiconductor LDs, such as a threshold current or driving voltage. Therefore, the yield and reliability of the semiconductor LDs decreases.

SUMMARY OF THE INVENTION

An advantage of the present invention is that it provides a method of isolating semiconductor LDs, in which base cut lines are partially formed on the surface of a substrate where the semiconductor LDs are formed, excluding ridge portions, such that the damage of the ridge portions and light emitting surfaces can be prevented.

Additional aspects and advantages of the present general inventive concept will be set forth in part in the description which follows and, in part, will be obvious from the description, or may be learned by practice of the general inventive concept.

According to an aspect of the invention, a method of isolating semiconductor laser diodes (LDs) comprises the steps of: preparing a substrate; forming a plurality of semiconductor LDs on the substrate, each semiconductor LD including an n-type semiconductor layer, an active layer, a p-type semiconductor layer, an n-electrode, a ridge portion, and a p-electrode, the ridge portion being formed by etching the p-type semiconductor layer such that a portion of the p-type semiconductor layer protrudes, the p-electrode being formed on the ridge portion; partially forming base cut lines on the surface of the substrate excluding the ridge portions; and isolating the semiconductor LDs into a bar shape along the base cut lines.

Preferably, a cut region having the base cut lines formed on the surface of the substrate occupies more than 75% of the overall region composed of the cut region and an uncut region where the base cut line is not formed.

Preferably, a ratio of the cut region to the uncut region is 3:1.

In the isolating of the semiconductor LDs, stress may be applied to the base cut line by repeatedly scribing a line along the base cut line.

The base cut line may be formed using a diamond knife.

In the preparing of the substrate, the substrate may be formed of a sapphire substrate or GaN substrate.

The method further comprises the step of cutting the bar-shaped semiconductor LD in a direction perpendicular to the base cut line such that the semiconductor LD is divided into a plurality of pieces.

According to another aspect of the invention, a method of isolating semiconductor LDs, comprises the steps of: preparing a substrate; forming a plurality of semiconductor LDs with a ridge portion on the substrate; and partially forming base cut lines on the surface of the substrate excluding the ridge portions. A cut region having the base cut lines formed on the surface of the substrate is three times longer than that of an uncut region where the base cut line is not formed.

Preferably, a ratio of the cut region to the uncut region is 3:1.

The method further comprises the step of isolating the semiconductor LDs by repeatedly scribing a line along the base cut lines using a knife for forming the base cut lines.

Preferably, the line is scribed more than two times.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a diagram showing a conventional method of isolating semiconductor LDs;

FIG. 2 is a diagram showing the structure of a general semiconductor LD;

FIGS. 3 and 4 are SEM photographs showing cut surfaces obtained by the conventional method of FIG. 1;

FIGS. 5A to 5C are diagrams showing a method of isolating semiconductor LDs according to the present invention;

FIG. 6 is a diagram showing the structure of a semiconductor LD according to the invention;

FIG. 7 is a diagram showing base cut lines formed on the surface of a substrate according to the invention; and FIGS. 8 and 9 are SEM photographs showing the cleavage surface of the semiconductor LD obtained through the method according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a method of isolating semiconductor laser diodes according to the present invention will be described in detail with reference to the accompanying drawings.

FIGS. 5A to 5C are process diagrams showing a method of isolating semiconductor laser diodes according to the invention.

First, as shown in FIG. 5A, a substrate 110 is prepared, and a plurality of semiconductor laser structures 150 having a ridge portion 147 are formed on the substrate 110.

Each of the semiconductor laser structures 150 may be formed by laminating and patterning a plurality of semiconductor layers. Referring to FIG. 6, the semiconductor laser structure will be described in detail.

As shown in FIG. 6, the semiconductor laser structure 150 includes an n-type semiconductor layer 120, an active layer 160, a p-type semiconductor layer 140, an n-electrode 129, a p-electrode 149, and a ridge portion 147. The n-type semiconductor layer 120, the active layer 160, and the p-type semiconductor layer 140 are sequentially laminated on the substrate 110. The n-electrode 129 and the p-electrode 149 serve to apply a current to the n-type semiconductor layer 120 and the p-type semiconductor layer 140, respectively. The ridge 147 is formed by etching the p-type semiconductor layer 140 such that a portion of the p-type semiconductor layer 140 protrudes.

Preferably, the substrate 110 is a sapphire substrate which is a heterogeneous substrate, but may be a group III-IV compound semiconductor substrate such as a GaN or SiC substrate.

The n-type semiconductor layer 120 includes a buffer layer 122, a first contact layer 124, a first clad layer 126, and a first waveguide layer 128, which are sequentially laminated on the substrate 110. The first waveguide layer 128 has a lower refractive index than the active layer 160 and a higher refractive index than the first clad layer 126.

The p-type semiconductor layer 140 includes a second waveguide layer 144, a second clad layer 146, and a second contact layer 148, which are sequentially laminated on the active layer 160. The second clad layer 146 is formed in such a manner that a portion thereof protrudes upward to thereby form the ridge portion 147. Further, the second contact layer 148 is formed on the top surface of the ridge portion 147.

The active layer 160 is a material layer in which light is generated by carrier recombination of electrons and holes which are supplied from the n-type semiconductor layer 120 and the p-type semiconductor layer 140. The active layer 160 has a multi-quantum well (MQW) structure.

The n-electrode 129 for supplying a current to the first contact layer 124 is formed on a mesa-etched portion of the first contact layer 124. Further, the p-electrode 149 for supplying a current to the second contact layer 148 is formed so as to cover the top surface of the second contact layer 148.

The ridge portion 147 for forming a ridge waveguide structure is formed by etching both sides of the second clad layer 146 such that a portion of the second clad layer 146 protrudes in a direction perpendicular to the active layer 160. A dielectric film 155 is formed on the surface of the second clad layer 146 and both side surfaces of the protruding ridge portion 147.

The above-described semiconductor laser structure has a horizontal structure that the n-electrode and the p-electrode are formed above the substrate. However, the semiconductor laser structure may have a vertical structure where the n-electrode is formed on the rear surface of the substrate.

After the semiconductor laser structures 150 are formed on the substrate 110, a plurality of base cut lines 170 for isolating the semiconductor laser structures 150 are formed on the surface of the substrate including the semiconductor laser structures 150.

At this time, the base cut lines 170 are formed in a direction parallel to a direction where a mirror surface of semiconductor laser LDs is to be formed.

The base cut lines 170 can be scribed in a predetermined direction by applying pressure onto the substrate using a mechanical tool such as a diamond knife.

Meanwhile, before the base cut lines 170 are formed, a grinding process such as lapping or polishing may be performed on the rear surface of the substrate 110 where the semiconductor laser structure 150 is not formed, thereby reducing the thickness of the substrate 110.

The base cut lines 170 are partially formed on the surface of the semiconductor laser structure 150 excluding the ridge portions 147.

Specifically, as shown in FIG. 7, the base cut line 170 on the substrate is divided into a cut region where the base cut line 170 is formed and an uncut region where the base cut line 170 is not formed. The uncut region corresponds to the ridge portion 147.

FIG. 7 is a diagram showing the base cut lines 170 formed on the semiconductor laser structure 150 of the substrate through the process of FIG. 5A.

As shown in FIG. 7, the base cut line 170 is selectively formed so as not to be formed on the ridge portion 147. The cut region I where the base cut line 170 is formed is three times longer than the uncut region II where the base cut line 170 is not formed.

That is, the cut region I should occupy more than 75% of the overall region of the base cut line 170 including the cut region I and the uncut region II, and a ratio of the cut region I and the uncut region II should be at least 3:1.

At this time, as the uncut region II is short, that is, as the cut region I is long, the light emitting surfaces of semiconductor LDs, which are to be formed after the cutting, can be smoothly formed.

In other words, the uncut region II is a region which is automatically cut while the cut region I is cut. As the uncut region II is long, the quality of the light emitting surfaces of the semiconductor LDs, which are formed when the uncut region II is automatically cut, is degraded.

Therefore, as the uncut region II is formed to include the ridge portion 147 at the maximum, that is, as the uncut region II is minimized, the quality of the light emitting surface is enhanced.

However, the width of the ridge portion of the semiconductor LD is about 2 μm. There are difficulties in forming the uncut region such that the length thereof is set to 2 μm, because of a limit in equipment for forming the base cut line.

Therefore, when the width of the ridge portion of the semiconductor LD is 2 μm, the length of the uncut region may be set in the range of 5 to 100 μm. Preferably, the length of the uncut region is set in the range of 5 to 50 μm.

The reason why the range of the uncut region is designed in such a manner is that an equipment for forming the base cut line has a limit. The range of the uncut region can be adjusted with the development of equipment. Therefore, in the present invention, the range of the uncut region is not limited to a specific range.

However, as the uncut region II is long, the quality of the light emitting surface decreases. Therefore, the base cut line can be formed in such a level that the quality of the light emitting surface does not decrease, that is, the cut region occupies more than 75% of the overall region.

Continuously, as shown in FIG. 5B, stress is applied to the base cut lines 170 to divide the substrate 110 having the semiconductor laser structures formed thereon into a plurality of bar-shaped pieces, after the base cut lines 170 are formed.

In this case, the application of stress may be performed by repeatedly scribing a line along the reference cutting line 170. That is, as the line is repeatedly scribed along the base cut line 170, the stress is applied to the base cut line 170. Then, the substrate 110 is cut along the base cut line 170, and the ridge portion 147 on which the base cut line 170 is not formed is automatically cut, while the neighboring region thereof is cut.

At this time, the substrate 110 can be cut by repeatedly scribing a line 2 to 5 times along the base cut line 170. However, the number of times is not limited to a specific number. In this case, the number of times may be set in such a manner that the substrate 110 can be divided by stress applied to the reference cutting line 170.

As the substrate 110 is cut, the light emitting surface of the semiconductor laser structure is formed on the cut surface corresponding to the ridge portion.

In the present invention, the base cut line 170 is not formed on the ridge portion 147, and a line is scribed several times along the base cut line 170 to apply stress to the substrate 110. Then, the substrate 110 is divided. Therefore, it is possible to prevent the damage of the ridge portion.

Further, since a stepped portion propagating from the substrate 110 is not formed, the light emitting surface can be more smoothly formed.

In the conventional method, the base cut lines are formed on the bottom surface of the substrate on which the semiconductor LDs are not formed, and a force is applied to the surface of the substrate on which the semiconductor LDs are formed so as to divide the substrate. Therefore, the force is concentrated on the ridge portion such that the ridge portion may be damaged. Further, the cut surface formed along the base cut line is not smooth, and a stepped portion is formed on the light emitting surface (cleavage surface). Therefore, the quality and yield thereof decrease.

In the invention, however, the base cut lines are formed on the surface of the substrate on which the semiconductor LDs are formed. Further, the base cut lines are selectively formed on the region excluding the ridge portions, and a line is repeatedly scribed along the base cut line so as to divide the substrate. Therefore, it is possible to prevent the damage of the ridge portions. Further, while the substrate is divided along the cut region where the base cut line is formed, the ridge portion is automatically separated. Therefore, striation propagating from the lower substrate is prevented, so that a smooth surface is formed.

After the light emitting surfaces are formed by dividing the substrate 110 along the base cut line 170 through the process of FIG. 5B, a process of cutting the substrate 110 in a direction perpendicular to the light emitting surface of the semiconductor LD is performed to thereby form a plurality of individual semiconductor LDs 150a, as shown in FIG. 5C.

FIGS. 8 and 9 are SEM (scanning electron microscope) photographs showing the cleavage surface of the semiconductor LD obtained through the method according to the invention. FIG. 8 shows the cleavage surface of the cut region I, and FIG. 9 shows the cleavage surface of the uncut region II, that is, the ridge portion.

As shown in FIGS. 8 and 9, it can be found that the surface is smoother than that obtained through the conventional method. In particular, the striation formed in the conventional method is not formed in the present invention.

In the invention, when the base cut lines are formed on the surface of the substrate on which the semiconductor LDs are formed, the base cut lines are partially formed on only the region excluding the ridge portions of the semiconductor LDs. Therefore, the ridge portion and the cleavage surface serving as a light emitting surface are prevented from being damaged. Therefore, the yield of the semiconductor LDs increases, and the electric and optical characteristics thereof are enhanced.

The feature of the invention is that the base cut lines are partially formed on the surface of the substrate excluding the ridge portion, and a line is repeatedly scribed along the base cut line to form the cleavage surface (light emitting surface). As long as the above-described concept is included, all methods may be included in the invention, regardless of the structure of a semiconductor LD formed on the substrate and the kind of the substrate. That is, the semiconductor LD may have a horizontal or vertical structure. Further, various substrates such as sapphire and GaN substrates may be used as the above-described substrate.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of isolating semiconductor laser diodes (LDs), comprising the steps of:
preparing a substrate;
forming a plurality of semiconductor LDs on the substrate, each semiconductor LD including an n-type semiconductor layer, an active layer, a p-type semiconductor layer, an n-electrode, a ridge portion, and a p-electrode, the ridge portion being formed by etching the p-type semiconductor layer such that a portion of the p-type semiconductor layer protrudes, the p-electrode being formed on the ridge portion;
partially forming base cut lines on the surface of the substrate excluding the ridge portions; and
isolating the semiconductor LDs into a bar shape along the base cut lines,
wherein a cut region having the base cut lines formed on the surface of the substrate occupies more than 75% of the overall region composed of the cut region and an uncut region where the base cut line is not formed, and
wherein a ratio of the cut region to the uncut region is 3:1.

2. A method of isolating semiconductor LDs, comprising the steps of:
preparing a substrate;
forming a plurality of semiconductor LDs with a ridge portion on the substrate; and
partially forming base cut lines on the surface of the substrate excluding the ridge portions,
wherein a cut region having the base cut lines formed on the surface of the substrate is three times longer than that of an uncut region where the base cut line is not formed, and
wherein a ratio of the cut region to the uncut region is 3:1.

3. The method according to claim 1, wherein in the isolating of the semiconductor LDs, stress is applied to the base cut line by repeatedly scribing a line along the base cut line.

4. The method according to claim 1, wherein in the preparing of the substrate, the substrate is formed of a sapphire substrate or GaN substrate.

5. The method according to claim 1 further comprising the step of:
cutting the bar-shaped semiconductor LD in a direction perpendicular to the base cut line such that the semiconductor LD is divided into a plurality of pieces.

6. The method according to claim 3, wherein the base cut line is formed using a diamond knife.

7. The method according to claim 2 further comprising the step of:
isolating the semiconductor LDs by repeatedly scribing a line along the base cut lines using a knife for forming the base cut lines.

8. The method according to claim 7, wherein the line is scribed more than two times.

* * * * *